(12) United States Patent
Park et al.

(10) Patent No.: US 11,094,580 B2
(45) Date of Patent: Aug. 17, 2021

(54) STRUCTURE AND METHOD TO FABRICATE FULLY ALIGNED VIA WITH REDUCED CONTACT RESISTANCE

(71) Applicant: International Business Machines Corporation, Armonk, NY (US)

(72) Inventors: Chanro Park, Clifton Park, NY (US); Kenneth Chun Kuen Cheng, Albany, NY (US); Koichi Motoyama, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 7 days.

(21) Appl. No.: 16/589,502

(22) Filed: Oct. 1, 2019

(65) Prior Publication Data
US 2021/0098287 A1 Apr. 1, 2021

(51) Int. Cl.
*H01L 21/76* (2006.01)
*H01L 21/768* (2006.01)
*H01L 23/522* (2006.01)
*H01L 23/532* (2006.01)

(52) U.S. Cl.
CPC .. *H01L 21/76816* (2013.01); *H01L 21/76885* (2013.01); *H01L 23/5226* (2013.01); *H01L 21/76831* (2013.01); *H01L 21/76882* (2013.01); *H01L 23/53257* (2013.01)

(58) Field of Classification Search
CPC ......... H01L 21/76816; H01L 21/76885; H01L 23/5226; H01L 21/76831; H01L 21/76882; H01L 23/53257
See application file for complete search history.

(56) References Cited

U.S. PATENT DOCUMENTS

| | | | |
|---|---|---|---|
| 8,299,625 B2 | 10/2012 | Ponoth et al. | |
| 8,828,862 B2 | 9/2014 | Horak et al. | |
| 9,324,650 B2 | 4/2016 | Edelstein et al. | |
| 9,793,163 B2 | 10/2017 | Bristol et al. | |
| 9,953,865 B1 | 4/2018 | Briggs et al. | |

(Continued)

FOREIGN PATENT DOCUMENTS

| | | |
|---|---|---|
| CN | 105493508 A | 4/2016 |
| KR | 20160098174 A | 8/2016 |
| KR | 20160098194 A | 8/2016 |

OTHER PUBLICATIONS

Anonymous, "Bi-directionally self-aligned vias," IP.com IPCOM000231097D, Sep. 26, 2013, 5 pages.

(Continued)

*Primary Examiner* — Peter Bradford
(74) *Attorney, Agent, or Firm* — L. Jeffrey Kelly; Ryan, Mason & Lewis, LLP (57) ABSTRACT

Techniques are provided to fabricate semiconductor devices. For example, a method includes forming a lower level interconnect line having a first hardmask layer thereon and embedded in a lower level dielectric layer. The first hardmask layer is removed to form a first opening having a first width in the lower level dielectric layer. The sidewalls of the lower level dielectric layer are etched in the first openings to form a second opening having a second width. The second width is greater than the first width. An upper level interconnect line is formed on the lower level interconnect line.

17 Claims, 9 Drawing Sheets

(56) References Cited

U.S. PATENT DOCUMENTS

| | | |
|---|---|---|
| 9,966,337 B1 | 5/2018 | Briggs et al. |
| 10,177,028 B1 | 1/2019 | LiCausi et al. |
| 2003/0186537 A1* | 10/2003 | Yamanaka ........ H01L 21/76808 438/637 |
| 2006/0234497 A1* | 10/2006 | Yang ................ H01L 21/76831 438/638 |
| 2009/0166612 A1 | 7/2009 | Cain et al. |
| 2012/0187566 A1 | 7/2012 | Horak et al. |
| 2015/0262873 A1* | 9/2015 | Chu ................ H01L 23/53295 257/773 |
| 2015/0380303 A1* | 12/2015 | Yang ................ H01L 21/02244 438/656 |
| 2017/0005069 A1* | 1/2017 | Chen ................ H01L 21/76807 |
| 2017/0194197 A1* | 7/2017 | Shiao ................ H01L 29/66795 |
| 2017/0301624 A1* | 10/2017 | Briggs ............. H01L 23/53238 |
| 2018/0040510 A1 | 2/2018 | Briggs et al. |

OTHER PUBLICATIONS

B.D. Briggs et al., "Pully Aligned via Integration for Extendibility of Interconnects to Beyond the 7nm Node," International Electron Devices Meeting (IEDM), Dec. 2-6, 2017, pp. 14.2.1-14.2.4.

* cited by examiner

FIG. 8

STRUCTURE AND METHOD TO FABRICATE FULLY ALIGNED VIA WITH REDUCED CONTACT RESISTANCE

BACKGROUND

With the current trends in integrated circuit (IC) miniaturization, and increasingly smaller critical dimensions, it is desirable in semiconductor device technology to integrate many different functions on a single chip. In the IC chip fabrication industry, there are three sections referred to in a typical IC chip build: front-end-of-line (FEOL), back-end-of-line (BEOL), and the section that connects those two together, the middle-of-line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices.

The FEOL transistor devices are typically processed using single crystal and poly-crystalline silicon. The BEOL interconnects are typically made of multiple metals; the bulk of the conductor is copper. If copper diffuses into the FEOL silicon-based devices, it can cause shorting or alter sensitive transistor characteristics and render the semiconductor useless. This is the reason for the MOL connection. BEOL generally begins when the first layer of metal is deposited on the wafer. BEOL includes contacts, insulating layers (dielectrics), metal levels, and bonding sites for chip-to-package connections.

Generally, ICs include a complex network of conductive interconnects fabricated on a semiconductor substrate in which semiconductor devices have been formed. Efficient routing of these interconnects requires formation of multi-level or multilayered schemes, such as, for example, single or dual damascene wiring structures.

The BEOL is the second portion of IC fabrication where the individual devices (transistors, capacitors, resistors, etc.) are interconnected with wiring on the wafer, i.e., the metallization layer. Common metals are copper interconnects and aluminum interconnects. BEOL generally begins when the first layer of metal is deposited on the wafer. BEOL includes contacts, insulating layers (dielectrics), metal levels, and bonding sites for chip-to-package connections.

SUMMARY

Embodiments described herein provide methods of forming interconnect structures.

For example, one exemplary embodiment includes a method for forming an interconnect structure. The method comprises forming a lower level interconnect line having a first hardmask layer thereon and embedded in a lower level dielectric layer. The method further comprises removing the first hardmask layer to form a first opening having a first width in the lower level dielectric layer. The method further comprises etching sidewalls of the lower level dielectric layer in the first opening to form a second opening having a second width. The second width is greater than the first width. The method further comprises forming an upper level interconnect line on the lower level interconnect line.

Another exemplary embodiment includes a method for forming an interconnect structure. The method comprises forming a first conductive metal layer on the base. The method further comprises forming a first hardmask layer on the first conductive metal layer. The method further comprises forming first metal lines by patterning the first hardmask layer and the first conductive metal layer above the base by subtractive etching, wherein a first opening is formed between adjacent first metal lines. The method further comprises depositing a dielectric layer in the first opening between the adjacent metal lines. The method further comprises removing the first hardmask layer to form a second opening having a first width in the dielectric layer. The method further comprises etching sidewalls of the dielectric layer in the second opening to form a third opening having a second width. The second width is greater than the first width. The method further comprises depositing a second conductive metal layer in the third opening and on a top surface of the dielectric layer. The method further comprises depositing a second hardmask layer on a top surface of the second conductive metal layer. The method further comprises forming second metal lines by patterning the second hardmask layer and the second conductive metal layer above the base by subtractive etching, wherein a fourth opening is formed between adjacent metal lines; and wherein a portion of the second conductive metal layer in the third opening is exposed.

Another exemplary embodiment includes an interconnect structure comprising a plurality of first metal lines on a base. The interconnect structure further comprises a dielectric layer disposed between adjacent first metal lines and on a top surface of the base. The interconnect structure further comprises a plurality of openings in the first dielectric layer configured to expose a top surface of the first metal line. The width of each opening is greater than a width of each first metal line. The interconnect structure further comprises a plurality of second metal lines disposed on a top surface the dielectric layer and in the plurality of openings.

These and other features, objects and advantages of the present invention will become apparent from the following detailed description of illustrative embodiments thereof, which is to be read in connection with the accompanying drawings.

DETAILED DESCRIPTION

This disclosure relates generally to integrated circuits (IC), and more particularly to semiconductor ICs, and methods for their construction.

With the IC being reduced in size over the years, the interconnect structure has also been reduced accordingly. When interconnects further scale down to a metal pitch of less than 25 nanometers (nm), there are challenges that exist. Presently there are several approaches to these challenges. One approach is a damascene based metallization technique. For example, there is a higher line resistance of dual damascene Cu BEOL metal line in smaller CD (<15 nm) than alternative metals such as Ru, Mo, etc. However, the aspect ratio of a tall metal line whose height includes metal line (Mx) and via (Vx) is too high thereby causing pattern collapse and/or line wiggling.

Accordingly, embodiments of the present invention provide a solution to interconnect technology. Exemplary embodiments generally relate to forming semiconductor interconnects by a subtractive patterning process that is more stable by lowering the aspect ratio of metal lines. The vias connecting lower level metal and upper level metal are fully aligned to both the upper and lower level metals. In addition, the vias' dimensions along the short axis of the lower level metal are thicker than that of the lower level metal to reduce via resistance.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Illustrative embodiments for forming a semiconductor device will be described below with reference to FIGS. 1-9B. Note that the same reference numeral (100) is used to denote the semiconductor structure throughout the various intermediate fabrication stages illustrated in FIGS. 1 through 9B. Note also that the semiconductor structure described herein can also be considered a semiconductor device and/or an integrated circuit, or some part thereof. For the purpose of clarity, some fabrication steps leading up to the production of the semiconductor structure as illustrated in FIGS.

1-9B are omitted. In other words, one or more well-known processing steps which are not illustrated but are well-known to those of ordinary skill in the art have not been included in the figures.

Figure 1:
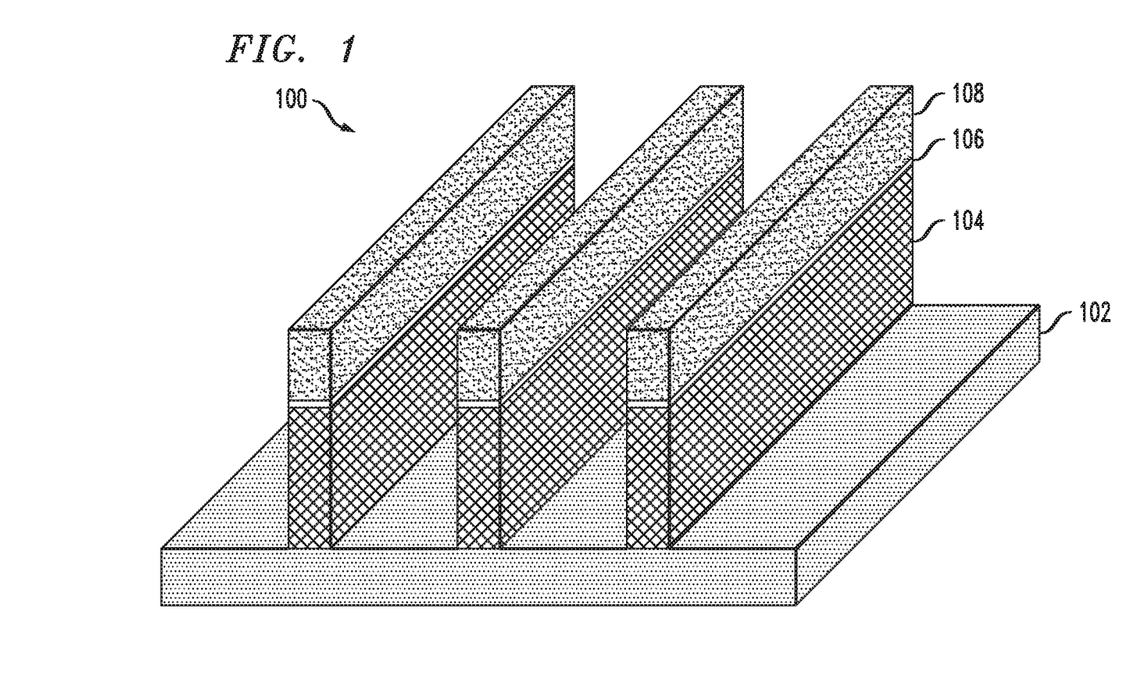
FIG. 1 is a perspective view of a semiconductor structure at a first-intermediate fabrication stage, according to an illustrative embodiment.

FIG. 1 shows a semiconductor structure 100 at a starting point according to an illustrative embodiment of the present invention. Semiconductor structure 100 comprises a base 102. In general, base 102 comprises a semiconductor substrate. The semiconductor substrate comprises a silicon substrate, such as a silicon wafer. In one illustrative embodiment, disposed on the semiconductor substrate is a BEOL stack. The BEOL stack comprises a plurality of metallization layers, dielectric layers and via layers. As one skilled in the art would understand, base 102 can be, for example, BEOL interconnects with BEOL interlevel dielectric (ILD) fill; a MOL contact with MOL ILD fill and FEOL devices.

Semiconductor structure 100 includes metal lines 104 on base 102. Suitable conductive metals for metal lines 104, i.e., metallization Mx level, are any conductive material that can be dry etched or patterned including, for example, aluminum (Al), chromium (Cr), hafnium (Hf), iridium (Ir), molybdenum (Mo), niobium (Nb), osmium (Os), rhenium (Re), rhodium (Rh), ruthenium (Ru), tantalum (Ta), titanium (Ti), tungsten (W), vanadium (V), zirconium (Zr), and alloys thereof. In one embodiment, metal lines 104 are formed by one or more of Al, Ru, Ta, Ti and W. In one embodiment, metal lines 104 are Ru.

Semiconductor structure 100 further includes optional etch stop layer 106 on metal lines 104. As one skilled in the art will understand, etch stop layer 106 will be made of a material with either a higher resistivity or a lower resistivity than the resistivity of metallization lines 104. Suitable materials for etch stop layer 106 include, for example, Ir, TaN, SiN, hydrogen-doped SiN, a nitrogen-doped silicon carbide (e.g., NBloK), etc., although other material suitable in providing etch-stop function may be used as well. In general, optional etch stop layer 106 can have a thickness ranging from about 0.5 to about 10 nm.

Semiconductor structure 100 further includes one or more hardmask layers 108 either on optional etch stop layer 106 or metal lines 104. Suitable material for hardmask layer 108 includes, for example, $SiO_2$, SiN, SiOCN, SiBCN, SiOC, SiC, etc., or combination of those layers. The thickness of hardmask layer 108 is determined based on the amount of material for one or more sacrificial layers 110 that will be removed during the removal of the hardmask layer 108 as discussed below. In general, hardmask layer 108 can have a thickness ranging from about 10 nm to about 100 nm.

In one embodiment, hardmask layer 108 is a bilayer of two different materials. The first hardmask layer on optional etch stop layer 106 or metal lines 104 will have an equal and known thickness to assist in reducing the via variation. The second hardmask layer on the first hardmask layer may have a varying thickness.

Figure 2:
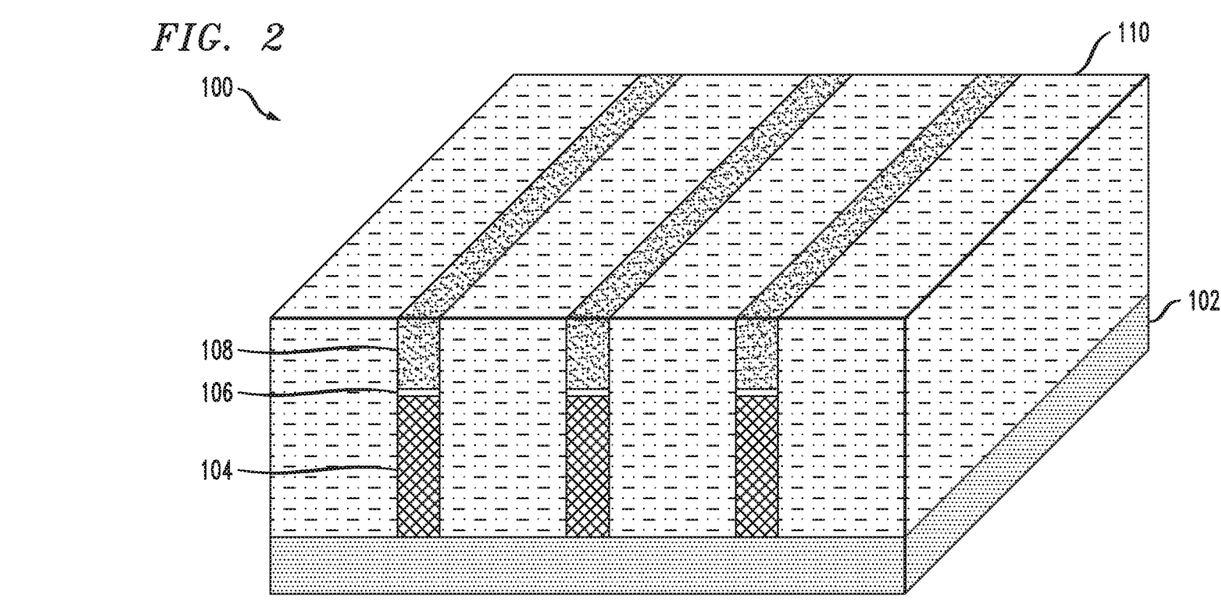
FIG. 2 is a perspective view of the semiconductor structure at a second-intermediate fabrication stage, according to an illustrative embodiment.

FIG. 2 illustrates a perspective view of semiconductor structure 100 at a second-intermediate fabrication stage. During this stage, one or more sacrificial layers 110 are deposited on the top surface of base 102 and over hardmask 108. The sacrificial layer 110 includes, for example, any suitable dielectric material such as silicon oxide, silicon nitride, hydrogenated silicon carbon oxide, low-k dielectrics, ultralow-k dielectrics, flowable oxides, porous dielectrics, or organic dielectrics including porous organic dielectrics. Low-k dielectric materials have a nominal dielectric constant less than the dielectric constant of $SiO_2$, which is approximately 4 (e.g., the dielectric constant for thermally grown silicon dioxide can range from 3.9 to 4.0). In one embodiment, low-k dielectric materials may have a dielectric constant of less than 3.7. Suitable low-k dielectric materials include, for example, fluorinated silicon glass (FSG), carbon doped oxide, a polymer, a SiCOH-containing low-k material, a non-porous low-k material, a porous low-k material, a spin-on dielectric (SOD) low-k material, or any other suitable low-k dielectric material. Ultra low-k (ULK) dielectric materials have a nominal dielectric constant less than 2.5. Suitable ultra low-k dielectric materials include, for example, SiOCH, porous pSiCOH, pSiCNO, carbon rich silicon carbon nitride (C-Rich SiCN), porous silicon carbon nitride (pSiCN), boron and phosporous doped SiCOH/pSi-COH and the like. In one embodiment, one or more sacrificial layers 110 includes a first ULK layer deposited on the base 102 and a sacrificial interlevel dielectric layer (ILD) on the ULK layer.

The one or more sacrificial layers 110 may be formed using any suitable deposition techniques including atomic layer deposition (ALD), chemical vapor deposition (CVD), plasma enhanced chemical vapor deposition (PECVD), physical vapor deposition (PVD), chemical solution deposition or other like processes. The one or more sacrificial layers 110 is then planarized by, for example, a planarization process such as CMP, to expose the top surface of hardmask 108.

Figure 3:
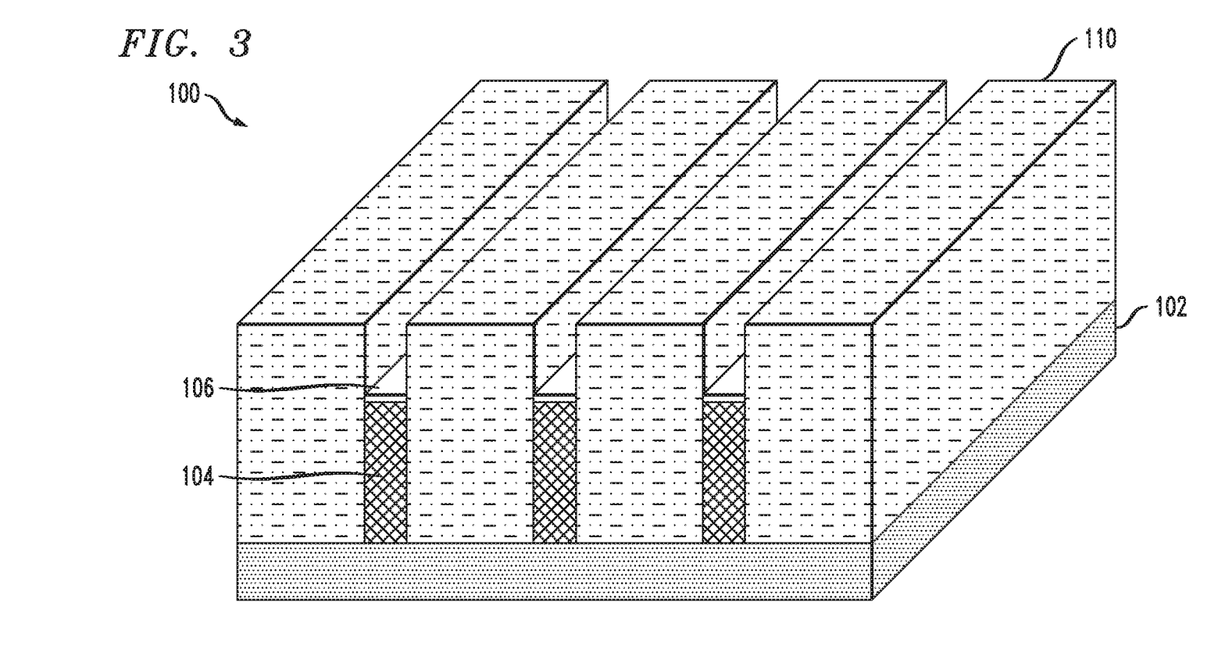
FIG. 3 is a perspective view of the semiconductor structure at a third-intermediate fabrication stage, according to an illustrative embodiment.

FIG. 3 illustrates a perspective view of semiconductor structure 100 at a third-intermediate fabrication stage. During this stage, hardmask 108 is subjected to an etching process such as, for example, a wet or dry chemical selective etching, or an anisotropic reactive ion etching (RIE) that is selective to hardmask 108 over one or more sacrificial layers 110 and either optional etch stop layer 106 or metal lines 104 to form openings. As discussed above, the thickness of the hardmask layer 108 is determined based on the amount of one or more sacrificial layers 110 that will be removed during this step. Accordingly, an etch chemistry that provides a greater etch rate for the hardmask 108 than for the one or more sacrificial layers 110 is employed.

Figure 4:
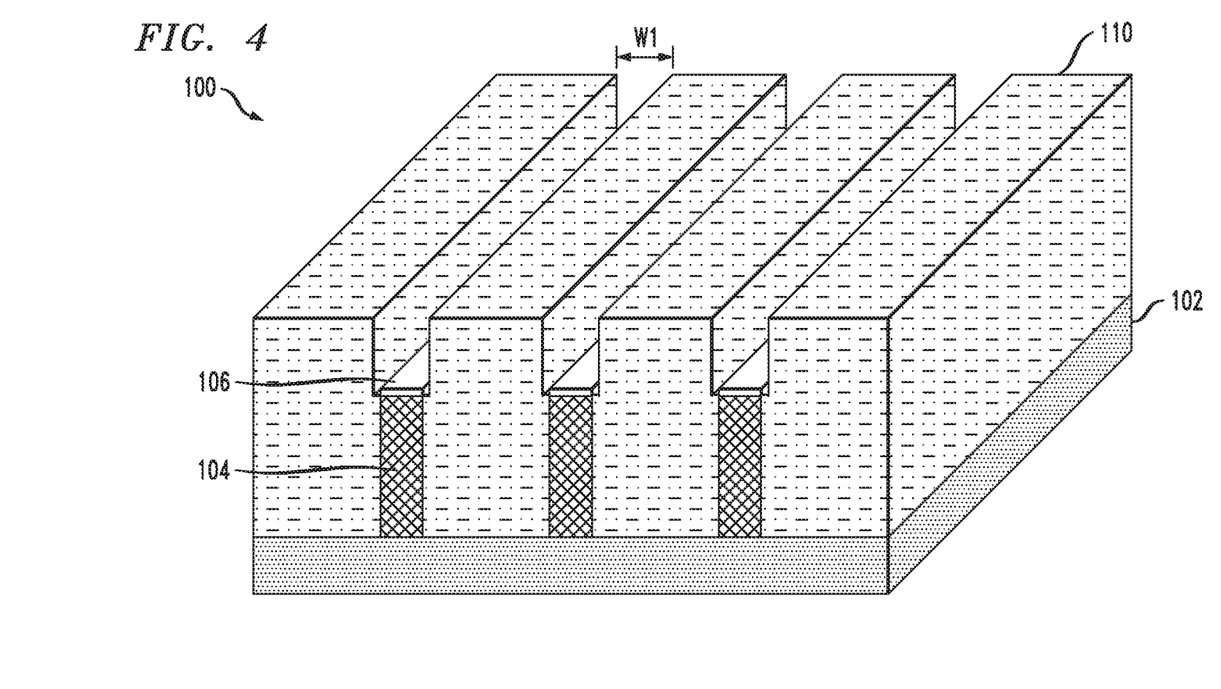
FIG. 4 is a perspective view of the semiconductor structure at a fourth-intermediate fabrication stage, according to an illustrative embodiment.
Figure 9A:
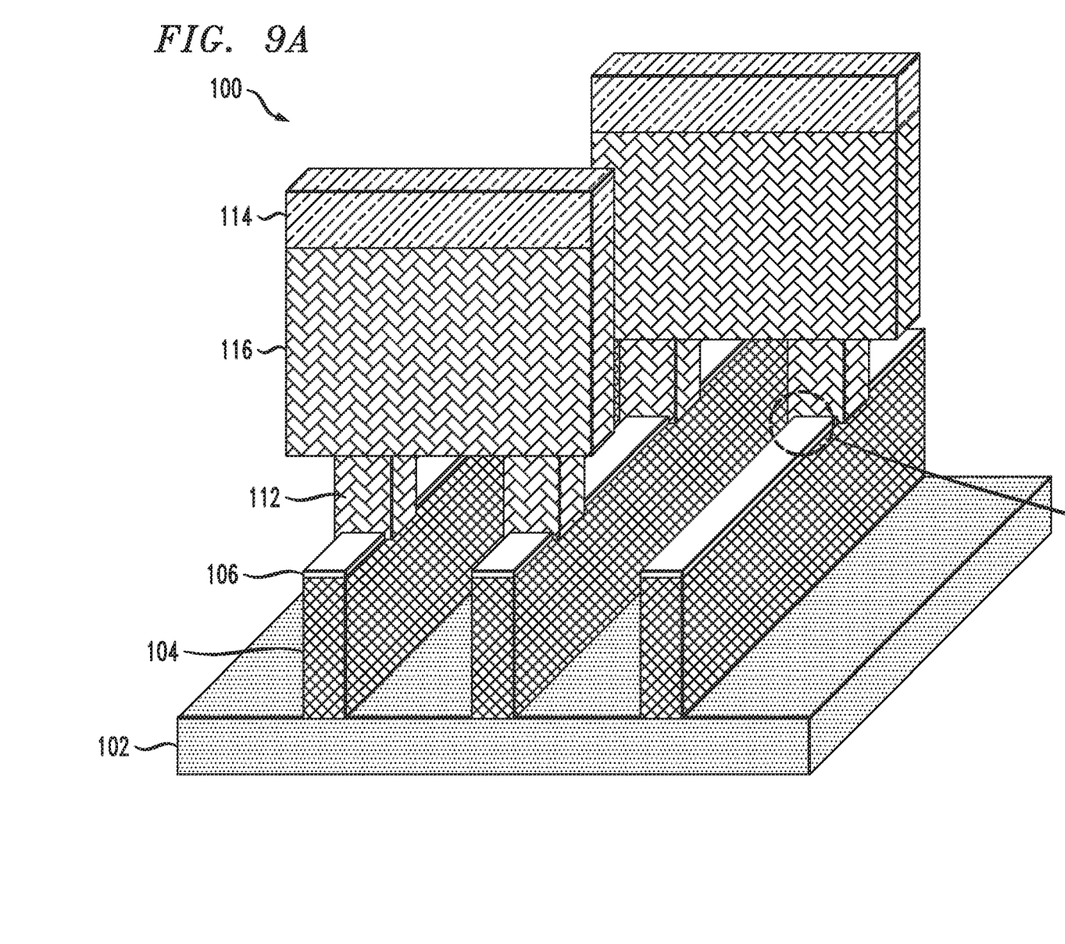
FIG. 9A is a perspective view of the semiconductor structure according to FIG. 8 without the sacrificial ILD layer, according to an illustrative embodiment.
Figure 9B:
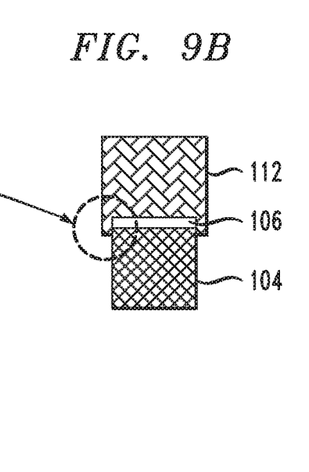
FIG. 9B is an exploded view of a semiconductor structure according to FIG. 9A, according to an illustrative embodiment.

FIG. 4 illustrates a perspective view of semiconductor structure 100 at a fourth-intermediate fabrication stage. During this stage, the sidewalls of one or more sacrificial layers 110 in the openings are etched to widen the width opening designated as W1. This step is carried out to reduce via contact resistance. The sidewalls of one or more sacrificial layers 110 in the openings are etched using an isotropic etch. The isotropic etch may be a wet or dry etch that is selective to one or more sacrificial layers 110. The etch time is preferably sufficient to remove a sufficient amount of the sidewalls of the one or more sacrificial layers 110 to achieve a desired width of the opening. In one embodiment, the lateral etch amount with respect to the unetched opening ranges from about 1 nanometer (nm) to about 5 nm per side. Isotropic etching also removes the sacrificial layers 110 vertically from about 1 nm to about 5 nm. This lateral and vertical etching of the sacrificial layers 110 provides a higher via contact area as shown in FIG. 9A and FIG. 9B.

Figure 5:
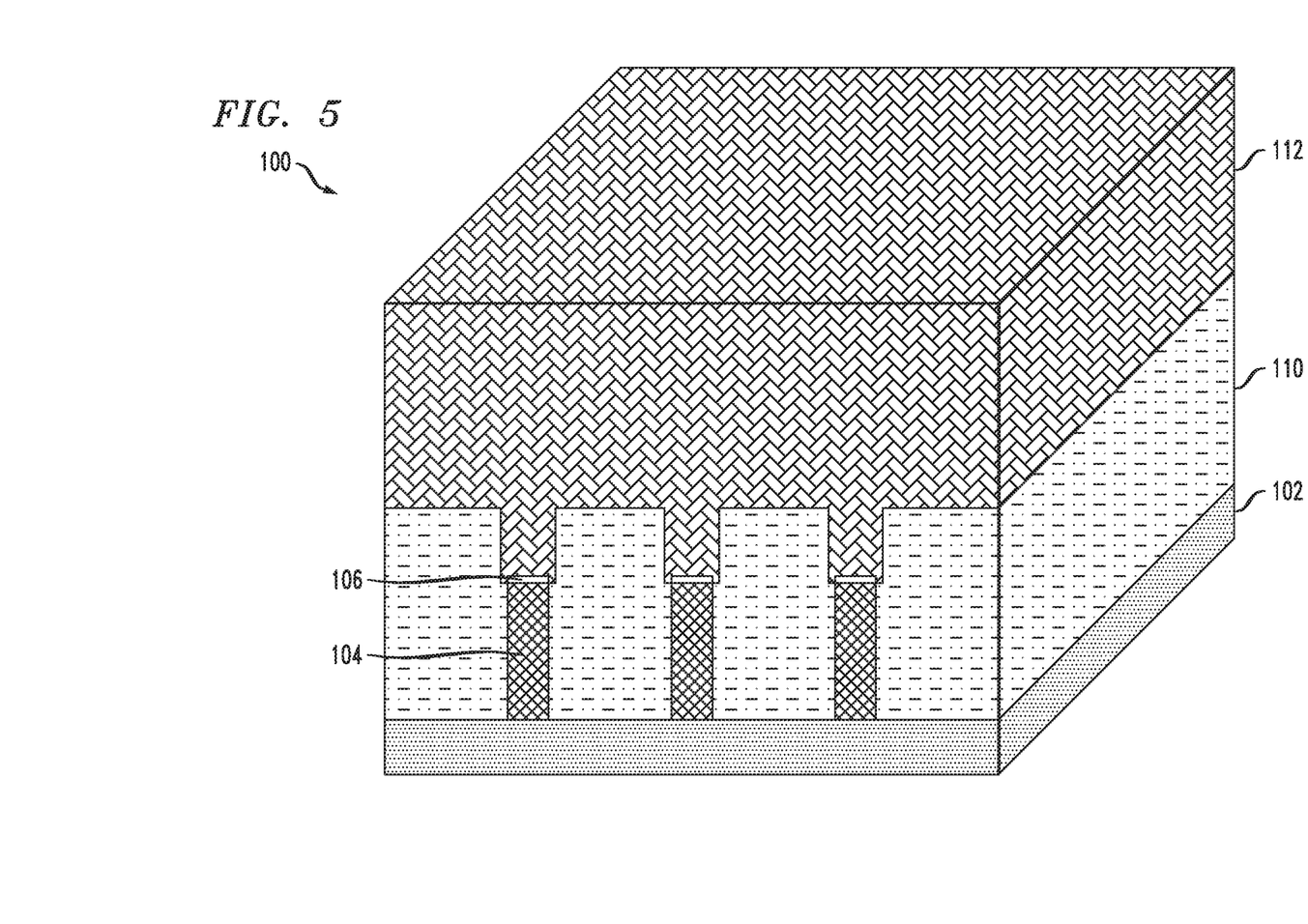
FIG. 5 is a perspective view of the semiconductor structure at a fifth-intermediate fabrication stage, according to an illustrative embodiment.

FIG. 5 illustrates a perspective view of semiconductor structure 100 at a fifth-intermediate fabrication stage. During this stage, metal layer 112 is deposited in the openings and on the top surface of one or more sacrificial layers 110. Metal layer 112 is formed by depositing a conductive material within the openings and top surface of one or more sacrificial layers 110 by a suitable deposition process including, but not limited, CVD, PECVD, PVD, plating, thermal or e-beam evaporation, sputtering, etc. Metal layer 112 is deposited to a desired thickness, e.g., a thickness ranging from about 20 nm to about 200 nm.

In one embodiment, metal layer 112 is deposited in a two-step process. First, the conductive material is deposited in the openings by either a plating or a reflow process to fill the openings. In one embodiment, a reflow process is carried out to flow the conductive material and fill the openings. The reflow process may be performed at a temperature of about 100° C. to about 450° C. The amount of conductive material on the top surface of one or more sacrificial layers 110 can be controlled with the coating thickness. An optional anneal may then performed to condense the conductive material. Next, the conductive material is further deposited on the top surface of one or more sacrificial layers 110 by way of PVD to form the metal layer 112.

The conductive material can be the same or different conductive metal as for metal lines 104. In one embodiment, the conductive material includes, for example, Al, W, Cu, Co, Ru, Mo, etc. After depositing the conductive material, metal layer 112 can then be planarized by, for example, a planarization process such as CMP.

Figure 6:
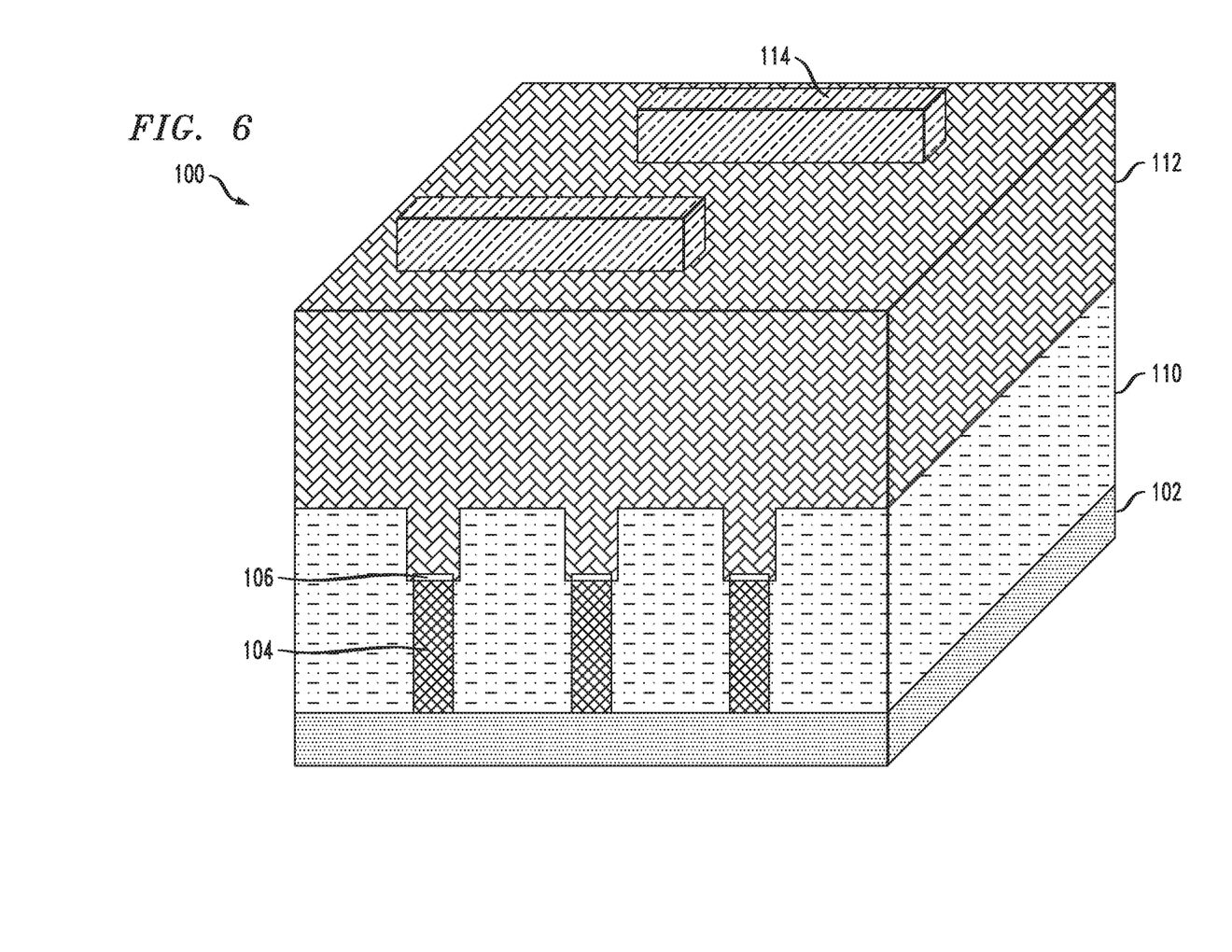
FIG. 6 is a perspective view of the semiconductor structure at a sixth-intermediate fabrication stage, according to an illustrative embodiment.

FIG. 6 illustrates a perspective view of semiconductor structure 100 at a sixth-intermediate fabrication stage. During this stage, hardmask layer 114 is deposited on metal layer 112 using a conventional deposition process, for example, CVD, PECVD, PVD, plating, thermal or e-beam evaporation, sputtering, etc. for patterning metal lines for forming metallization Mx+1 level. Suitable material for hardmask layer 114 can be the same material as described for hardmask layer 108.

Figure 7:
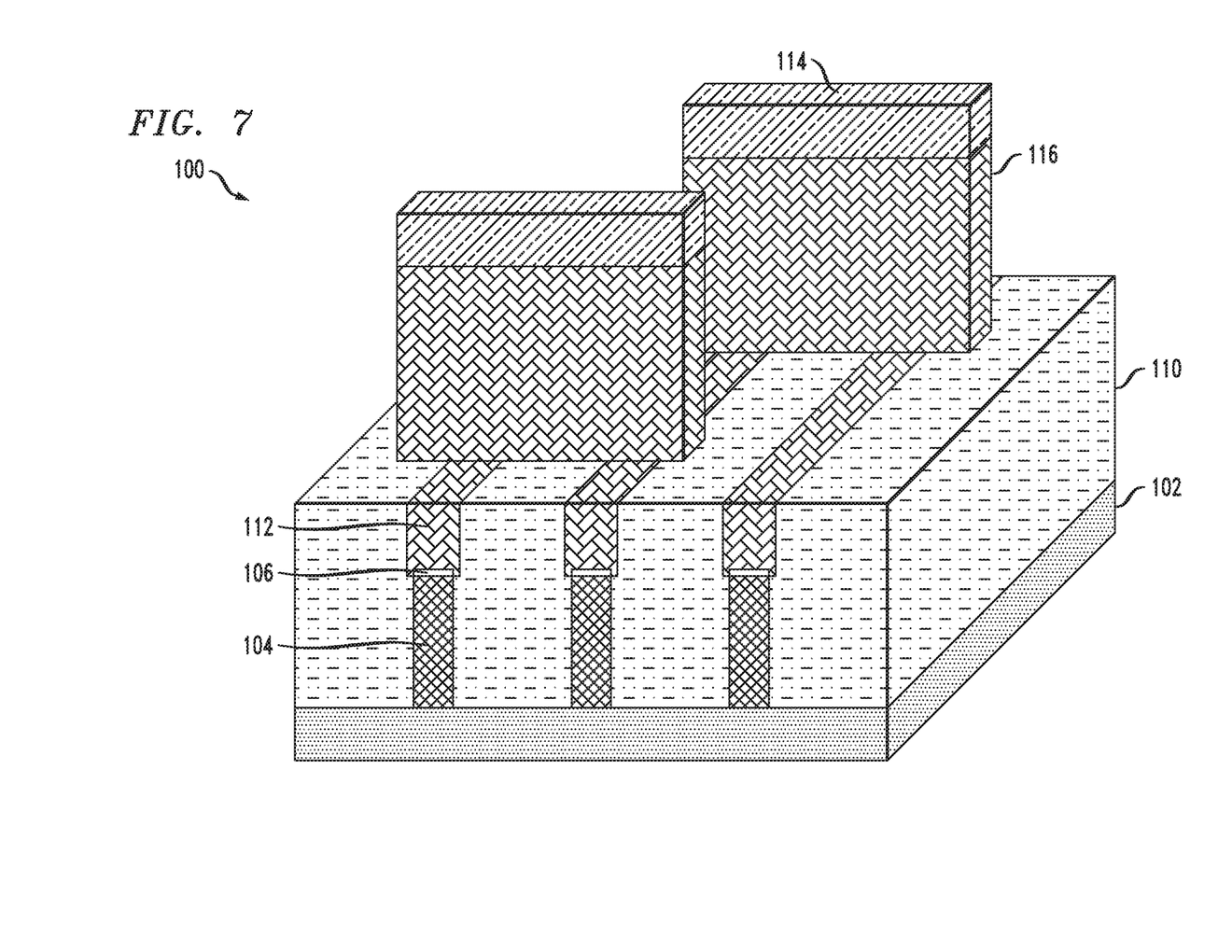
FIG. 7 is a perspective view of the semiconductor structure at a seventh-intermediate fabrication stage, according to an illustrative embodiment.

FIG. 7 illustrates a perspective view of semiconductor structure 100 at a seventh-intermediate fabrication stage. During this stage, a subtractive metal etch is carried out to etch only those portions of metal layer 112 that will become metal lines 116. Accordingly, a subtractive patterning process is performed using lithography and a metal etch process such as anisotropically etching metal lines selective to hardmask layer 114 to form metal lines 116 at a desired location on one or more sacrificial layers 110 and the metal layer 112 in the openings.

Figure 8:
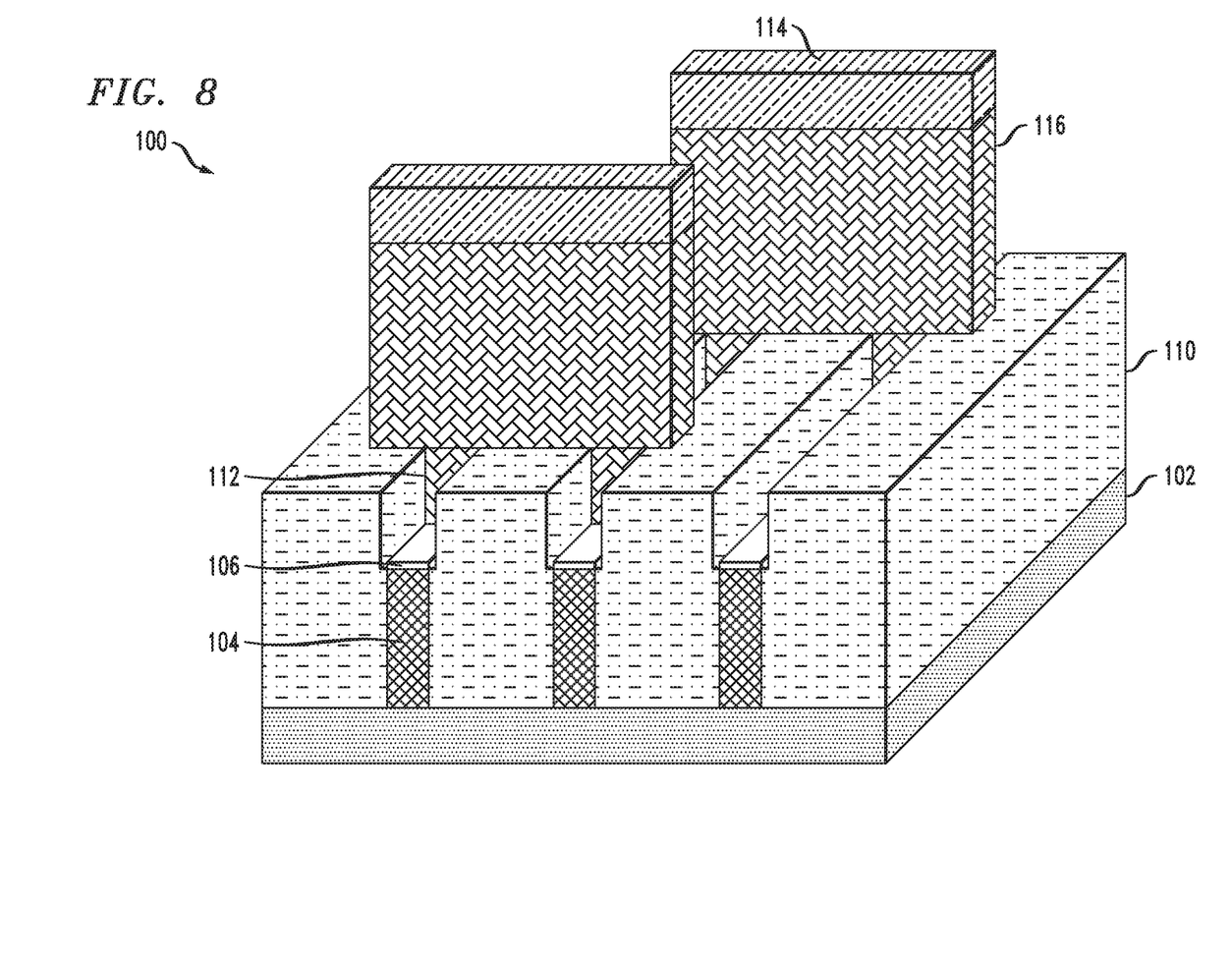
FIG. 8 is a perspective view of the semiconductor structure at an eighth-intermediate fabrication stage, according to an illustrative embodiment.

FIG. 8 illustrates a perspective view of semiconductor structure 100 at an eighth-intermediate fabrication stage. During this stage, vias are formed by removing the exposed metal layer 112 remaining in the vias after the subtractive metal etch is carried out. The exposed metal layer 112 can be removed using, for example, RIE. This allows a larger contact area and therefore smaller via contact resistance as can be seen in FIGS. 9A and 9B by forming metal lines 116 which extend over metal layer 112 and where metal layer 112 extends over etch stop layer 106 and metal lines 104. As illustrated in FIG. 9B, the circled region shows that the via contact area to lower level metal (Mx) has increased by the lateral and vertical removal of the sacrificial layers 110.

It is to be further understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing embodiments of the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A method comprising:
    forming a lower level interconnect line having a first hardmask layer thereon and embedded in a lower level dielectric layer;
    removing the first hardmask layer to form first openings having a first width in the lower level dielectric layer;
    etching sidewalls of the lower level dielectric layer in the first openings to form second openings having a second width, wherein the second width is greater than the first width; and
    forming an upper level interconnect line on the lower level interconnect line.

2. The method of claim 1, wherein the step of forming the upper level interconnect line comprises:
    depositing a conductive metal layer in the second openings and on a top surface of the lower level interconnect line;
    depositing a second hardmask layer on the conductive metal layer; and
    forming the upper level interconnect line by patterning the second hardmask layer and the conductive metal layer by subtractive etching and exposing the conductive metal layer in the second openings.

3. The method of claim 2, further comprising removing the exposed conductive metal layer in the second openings.

4. The method of claim 1, wherein the lower level interconnect line and the upper level interconnect line are the same conductive metal.

5. The method of claim 4, wherein the conductive metal is ruthenium.

6. The method of claim 1, wherein the first hardmask layer is a bilayer comprising a first layer on the lower level interconnect line and a second layer on the first layer.

7. The method of claim 6, wherein the first layer has a uniform thickness and the second layer has a non-uniform thickness.

8. The method of claim 1, wherein the lower level dielectric layer comprises a first layer and a second layer.

9. The method of claim 8, wherein the first layer comprises an ultra low-k dielectric layer and the second layer comprises an interlevel dielectric layer.

10. A method comprising:
forming a first conductive metal layer on the base;
forming a first hardmask layer on the first conductive metal layer;
forming first metal lines by patterning the first hardmask layer and the first conductive metal layer above the base by subtractive etching, wherein a first opening is formed between adjacent first metal lines;
depositing a dielectric layer in the first opening between the adjacent metal lines;
removing the first hardmask layer to form a second opening having a first width in the dielectric layer;
etching sidewalls of the dielectric layer in the second opening to form a third opening having a second width, wherein the second width is greater than the first width;
depositing a second conductive metal layer in the third opening and on a top surface of the dielectric layer;
depositing a second hardmask layer on a top surface of the second conductive metal layer; and
forming second metal lines by patterning the second hardmask layer and the second conductive metal layer above the base by subtractive etching, wherein a fourth opening is formed between adjacent metal lines; and
wherein a portion of the second conductive metal layer in the third opening is exposed.

11. The method of claim 10, further comprising removing the exposed second conductive metal layer in the third opening.

12. The method of claim 10, wherein the first conductive metal layer and the second conductive metal layer are the same conductive metal.

13. The method of claim 10, further comprising forming an etch stop layer on the first conductive metal layer prior to forming the first hardmask layer.

14. The method of claim 10, wherein the first hardmask layer is a bilayer comprising a first layer on the first conductive metal layer and a second layer on the first layer.

15. The method of claim 14, wherein the first layer has a uniform thickness and the second layer has a non-uniform thickness.

16. The method of claim 10, wherein the step of depositing the dielectric layer comprises depositing an ultra low-k dielectric layer in a portion of the first opening between the adjacent metal lines and depositing an interlevel dielectric layer on the ultra low-k dielectric layer.

17. The method of claim 10, wherein the step of etching the sidewalls of the dielectric layer in the second opening comprises isotropic etching the sidewalls of the dielectric layer in the second opening.

* * * * *